United States Patent
Hsu et al.

(10) Patent No.: US 8,138,956 B2
(45) Date of Patent: Mar. 20, 2012

(54) CABAC ENCODER AND CABAC ENCODING METHOD

(75) Inventors: Pei-Wei Hsu, Taipei (TW); Chih-Hui Kuo, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 961 days.

(21) Appl. No.: 12/131,245

(22) Filed: Jun. 2, 2008

(65) Prior Publication Data
US 2009/0296806 A1    Dec. 3, 2009

(51) Int. Cl.
H03M 7/30 (2006.01)
(52) U.S. Cl. .................................. 341/107; 375/240.23
(58) Field of Classification Search .................. 341/107, 341/51, 50; 375/240.23; 382/247
See application file for complete search history.

(56) References Cited

U.S. PATENT DOCUMENTS

| | | | |
|---|---|---|---|
| 5,960,116 A * | 9/1999 | Kajiwara | 382/238 |
| 7,262,722 B1 | 8/2007 | Jahanghir et al. | |
| 7,292,165 B2 | 11/2007 | Cha | |
| 7,339,507 B1 | 3/2008 | Guo et al. | |
| 7,365,660 B2 | 4/2008 | Park | |
| 7,385,535 B2 * | 6/2008 | Yang et al. | 341/107 |
| 7,408,487 B2 | 8/2008 | Cho | |
| 7,423,562 B2 | 9/2008 | Kim et al. | |
| 7,460,042 B2 | 12/2008 | Oshikiri | |
| 7,592,937 B1 * | 9/2009 | Chang | 341/107 |
| 7,830,284 B2 * | 11/2010 | Kawakami | 341/107 |
| 2007/0080832 A1 | 4/2007 | Yang et al. | |
| 2008/0001796 A1 | 1/2008 | Oshikiri et al. | |
| 2008/0246637 A1 | 10/2008 | Chen et al. | |

FOREIGN PATENT DOCUMENTS
EP    1624579 A2    2/2006

OTHER PUBLICATIONS

"A High Performance CABAC Decoding Architecture" Yu Wei et al, IEEE Transactions on Consumer Electronics, vol. 51, No. 4, Nov. 2005.
"High-Throughput Architecture for H.264/AVC CABAC Compression System" Osorio Roberto R. et al, IEEE Transactions on Circuits and Systems for Video Technology, vol. 6., No. 11, Nov. 2006.
Notice of Allowance issued in related U.S. Appl. No. 12/131,208 on May 21, 2009.
"A High Performance CABAC Decoding Architecture" Yu Wei et al.; IEEE Transactions on Consumer Electronics, vol. 51, No. 4, Nov. 2005. Texas Instruments; "Parallel CABAC;" ITU-T SG16 Meeting; Apr. 22, 2008-May 2, 2008; Geneva, No. T05-5G16-C-0334, Apr. 11, 2008, XP030003826, ISSN:0000-0052.
"The Context-based Adaptive Binary Arithmetic Coding in H.264;" Master's Thesis of Xidian University, Apr. 27, 2007.
English language translation of abstract of "The Context-based Adaptive Binary Arithmetic Coding in H.264."

* cited by examiner

Primary Examiner — Peguy Jean Pierre
(74) Attorney, Agent, or Firm — Thomas|Kayden

(57) ABSTRACT

A CABAC encoding method includes: receiving first and second coefficient flags (Sig, Last); detecting coefficient flags according to positions of the detected coefficient flags and control signal (Sig_first); generating first bin and second bin (bin_val_1, bin_val_2) corresponding to the detected coefficient flags according to the detecting result; updating a value of the second control signal (Sig_first) for the next clock cycle according to the detecting result; generating first and second position parameters (Sig/Last_pos_1, Sig/Last_pos_2) corresponding to the positions of the first and second bins (bin_val_1, bin_val_2); generating a first context index (Ctx_idx_1) according to the control signal (Sig_first) and the first position parameter (Sig/Last_pos_1) and a second context index (Ctx_idx_2) according to the control signal (Sig_first), the second position parameter (Sig/Last_pos_2) and the first bin (bin_val_1); and encoding the first and second bins (bin_val_1, bin_val_2) according to the first and second context indexes (Ctx_idx_1, Ctx_idx_2) respectively to generate the bit stream.

25 Claims, 3 Drawing Sheets

CABAC ENCODER AND CABAC ENCODING METHOD

CROSS REFERENCE TO RELATED APPLICATIONS

This application is related to co-pending U.S. utility application Ser. No. 12/131,208, filed on Jun. 2, 2008, entitled CABAC decoding unit and method, the entirety of which is incorporated herein by reference.

BACKGROUND OF THE INVENTION

1. Field of the Invention

The invention relates to an encoding method, and in particular relates to a CABAC encoding method.

2. Description of the Related Art

The H.264/MPEG-4 Advanced Video Coding (AVC) video coding standard provides a significant compression gain over previous standards. H.264/MPEG-4 AVC is a recent video coding standard that makes use of several advanced video coding tools to provide better compression performance than existing video coding standards such as, MPEG-2, MPEG-4 and H.263.

A context-based adaptive binary arithmetic coding (CABAC) has been adopted as a normative part of the H.264/MPEG-4 AVC standard. It is one of two alternative methods of entropy coding in the H.264/AVC coding standard. The other method specified in H.264/AVC is a low-complexity entropy-coding technique based on the usage of context-adaptively switched sets of variable-length codes, so-called Context-Adaptive Variable-Length Coding (CAVLC). Compared to CABAC, CAVLC offers reduced implementation costs at the price of lower compression efficiency. Thus, for TV signals in standard-definition or high-definition resolution, CABAC typically provides bit-rate savings of 10-20% relative to CAVLC at the same objective video quality.

CABAC involves three key elements: 1) binarization of the input symbol stream to yield a stream of binary symbols (bins); 2) context modeling (conditional probability that a bin is 0 or 1 depending on previous bin values); and 3) binary arithmetic coding (recursive interval subdivision with subdivision according to conditional probability).

However, the computational complexity of the CABAC of H.264/AVC video coding standard is a problem. The complexity of the CABAC of H.264/AVC video coding standard increases probability that the encoding speed and decoding speed is hindered. One conventional approach to the problem includes running the encoding/decoding hardware at a high frequency to handle the computational complexity problem. But, the disadvantage of the conventional approach is to raise the operational frequency of the corresponding hardware. Thus, improving CABAC encoding efficiency without raising the operational frequency of the corresponding hardware is desired.

BRIEF SUMMARY OF THE INVENTION

A detailed description is given in the following embodiments with reference to the accompanying drawings.

An embodiment of a CABAC encoder is provided. The CABAC encoder comprises a reorganizing unit, a first context formation engine, a second context formation engine and a CABAC coding engine. The reorganizing unit receives a plurality of first coefficient flags (Sig) and second coefficient flags (Last), detects at least two of the coefficient flags every clock cycle according to positions of the detected coefficient flags and a control signal (Sig_first) to generate a first bin (bin_val_1) and a second bin (bin_val_2) corresponding to the detected coefficient flags, updates a value of the next control signal (Sig_first) for a next clock cycle according to the detecting result, and generates a first position parameter (Sig/Last_pos_1) and a second position parameter (Sig/Last_pos_2) corresponding to positions of the first bin (bin_val_1) and a second bin (bin_val_2). The first context formation engine generates a first context index (Ctx_idx_1) according to the control signal (Sig_first) and the first position parameter (Sig/Last_pos_1). The second context formation engine generates a second context index (Ctx_idx_2) according to the control signal (Sig_first), the second position parameter (Sig/Last_pos_2) and the first bin (bin_val_1). The CABAC coding engine receives the first context index (Ctx_idx_1), the second context index (Ctx_idx_2), the first bin (bin_val_1) and the second bin (bin_val_2) and encodes the first bin (bin_val_1) according to the first context index (Ctx_idx_1) and encodes the second bin (bin_val_2) according to the second context index (Ctx_idx_2) to generate a bit stream. The first bin (bin_val_1) and the second bin (bin_val_2) are generated in one clock cycle, the first coefficient flag (Sig) indicates whether a corresponding coefficient value is zero, and the second coefficient flag (Last) indicates whether a coefficient map decoding process is finished.

Another embodiment of a CABAC encoding method for generating a bit stream is provided. The method comprises: receiving a plurality of first coefficient flags (Sig) and second coefficient flags (Last); detecting at least two coefficient flags every clock cycle according to positions of the detected coefficient flags and a control signal (Sig_first); generating a first bin (bin_val_1) and a second bin (bin_val_2) corresponding to the detected coefficient flags according to the detecting result; updating a value of the second control signal (Sig_first) for the next clock cycle according to the detecting result; generating a first position parameter (Sig/Last_pos_1) and a second position parameter (Sig/Last_pos_2) corresponding to the positions of the first bin (bin_val_1) and second bin (bin_val_2); generating a first context index (Ctx_idx_1) according to the control signal (Sig_first) and the first position parameter (Sig/Last_pos_1) and a second context index (Ctx_idx_2) according to the control signal (Sig_first), the second position parameter (Sig/Last_pos_2) and the first bin (bin_val_1); and encoding the first bin (bin_val_1) and the second bin (bin_val_2) according to the first context index (Ctx_idx_1) and the second context index (Ctx_idx_2) respectively to generate the bit stream. The first bin (bin_val_1) and the second bin (bin_val_2) are generated in one clock cycle, the first coefficient flag (Sig) indicates whether a corresponding coefficient value is zero, and the second coefficient flag (Last) indicates whether a coefficient map decoding process is finished.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

With regard to the H.264 CABAC specification, a bin may correspond to one of syntax elements including a first coefficient flag (significant_coeff_flag, Sig), a second coefficient flag (last_significant_coeff_flag, Last) and a corresponding coefficient value. The first coefficient flag (Sig), the second coefficient flag (Last) and the corresponding coefficient value, respectively present different functions or meanings. For example, first coefficient flag (Sig) represents whether the corresponding coefficient value is equal to zero. When the first coefficient flag (Sig) is one, the corresponding coefficient value is not a zero number; otherwise, the corresponding coefficient value is zero when the first coefficient flag (Sig) is zero. When the second coefficient flag (Last) is one, it means that the coefficient map encoding process in CABAC encoding operation is finished. Conversely, when the second coefficient flag (Last) is zero, the encoding process is not finished.

Figure 1:
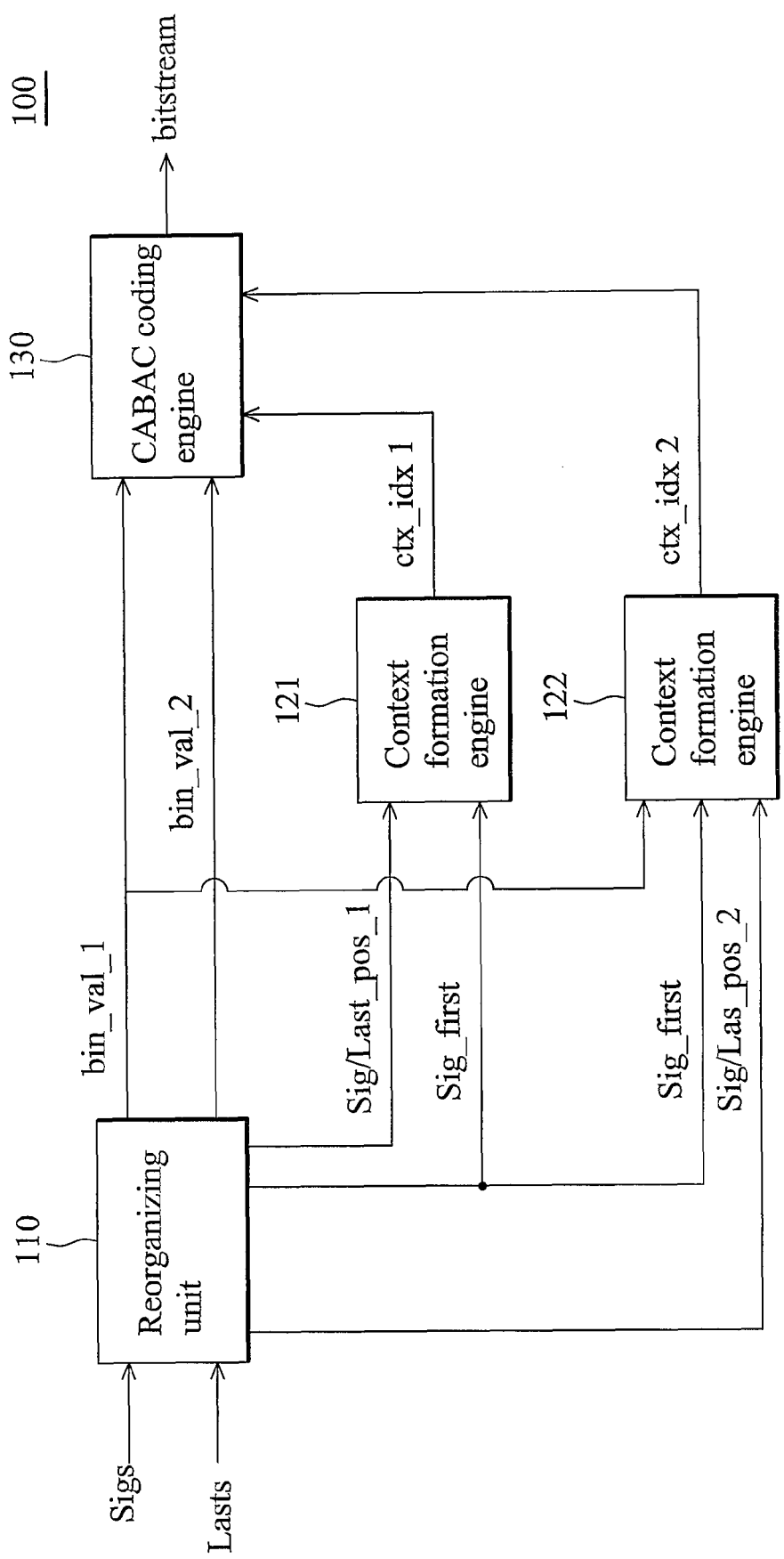
FIG. 1 is a schematic block diagram of a CABAC encoder according to an embodiment of the invention.

FIG. 1 is a schematic block diagram of a CABAC encoder 100 according to an embodiment of the invention. The CABAC encoder 100 comprises a reorganizing unit 110, context formation engines 121 and 122 and a CABAC coding engine 130. The reorganizing unit 110 receives a plurality of first coefficient flags (Sig) and second coefficient flags (Last) and detects at least two of the coefficient flags, such as first coefficient flag (Sig) or second coefficient flags (Last), every clock cycle according to a control signal (Sig_first). For example, the reorganizing unit 110 detects two first coefficient flags (Sig) or one first coefficient flag (Sig) and one second coefficient flag (Last) every clock cycle according to the control signal (Sig_first). The reorganizing unit 110 accordingly generates a first bin (bin_val_1) and a second bin (bin_val_2) representing the two detected coefficient flags, updates a value of the control signal (Sig_first) for next clock cycle according to the detecting result, and generates a first position parameter (Sig/Last_pos_1) indicating the position of the first bin (bin_val_1) and a second position parameter (Sig/Last_pos_2) indicating the position of the second bin (bin_val_2) according to the detecting result and the control signal (Sig_first). The detailed operation of the CABAC encoder 100 is described as follows.

Note that the first position parameter (Sig/Last_pos_1) can be a parameter (Sig_pos_1) or a parameter (Last_pos_1) indicating the position of the first bin (bin_val_1) corresponding to a first coefficient flag (Sig) or a second coefficient flag (Last) respectively. Similarly, the second position parameter (Sig/Last_pos_2) can be a parameter (Sig_pos_2) or a parameter (Last_pos_2).

According to an embodiment of the invention, if the reorganizing unit 110 first detects the first significant flag (Sig), the reorganizing unit 110 outputs the first position parameter (Sig_pos_1) corresponding to a position of the detected first coefficient flag (Sig) to the context formation engines 121. If the reorganizing unit 110 first detects the second significant flag (Last), the reorganizing unit 110 outputs the first position parameter (Last_pos_1) corresponding to a position of the detected second coefficient flag (Last) to the context formation engines 121. Similarly, if the reorganizing unit 110 detects the first coefficient flag (Sig) after detecting one of the first coefficient flag or the second coefficient (Last), the reorganizing unit 110 outputs the second position parameter (Sig_pos_2) to the context formation engines 122. If the reorganizing unit 110 detects the second significant flag (Last) after detecting one of the first coefficient flag or the second coefficient (Last), the reorganizing unit 110 outputs the second position parameter (Last_pos_2) to the context formation engines 122.

The first context formation engine 121 generates a first context index (Ctx_idx_1) according to the control signal (Sig_first) and the first parameter (Sig/Last_pos_1). The second context formation engine 122 generates a second context index (Ctx_idx_2) according to the control signal (Sig_first), the second parameter (Sig/Last_pos_2) and the first bin (bin_val_1). That is the second context formation engine 122 determines the second parameter (Sig/Last_pos_2) being one of the position parameters Sig_pos_2 and Last_pos_2 according to the first bin (bin_val_1) and the control signal (Sig_first) and outputs the second context index (Ctx_idx_2) accordingly. For example, when the control signal (Sig_first) is one and the first bin (bin_val_1) is one, the second context formation engine 122 determines the second parameter (Sig/Last_pos_2) being the second position parameter (Last_pos_2) and outputs the second context index (Ctx_idx_2) accordingly. Upon receiving the first context index (Ctx_idx_1), the second context index (Ctx_idx_2), the first bin (bin_val_1) and the second bin (bin_val_2), the CABAC coding engine 130 encodes the first bin (bin_val_1) and the second bin (bin_val_2) according to the first context index (Ctx_idx_1) and the second context index (Ctx_idx_2) respectively and generates a bitstream.

The control signal (Sig_first) is used for determining the two coefficient flags detected by the reorganizing unit 110 being first coefficient flag (Sig) or second coefficient flag (Last). According to an embodiment of the invention, when the control signal (Sig_first) is one, the reorganizing unit 110 detects the first coefficient flag (Sig) and generates the first bin (bin_val_1) corresponding to the first coefficient flag (Sig). When the detected first coefficient flags (Sig) is one, the reorganizing unit 110 proceeds to detect the second coefficient flag (Last) and generates the second bin (bin_val_2) corresponding to the second coefficient flag (Last). The reorganizing unit 110 further outputs the position parameter (Sig_pos_1) and the position parameter (Last_pos_2) for the first bin (bin_val_1) and the second bin (bin_val_2) to the context formation engines 121 and 122 respectively.

In the first case, when the control signal (Sig_first) is one, the first coefficient flag (Sig) is one and the second coefficient flag (Last) is zero, the value of the control signal (Sig_first) updated by the reorganizing unit 110 for the next clock cycle is one and the first position parameter (Sig_pos_1) for the next clock cycle is added one for indicating where to detect coefficient flags during the next clock cycle (case 1). For example, according to the first case, both of the position parameters of the detected first coefficient flag (Sig) and the second coefficient flag (Last), Sig_pos_1 and Last_pos_2, are "a". The reorganizing unit 110 then will first detect the first coefficient flag (Sig) during the next clock cycle according to the first position parameter Sig_pos_1 of "a+1" (Add one to the current first position parameter Sig_pos_1 of "a"). The value of the second position parameter Sig/Last_pos_2, however, depends on the value of the first coefficient flag (Sig) detected during next cycle. For example, if the first coefficient flag (Sig) detected at position "a+1" during next cycle is one, the second position parameter Sig/Last_pos_2 is "a+1" and corresponds to a second coefficient flag (Last).

In the second case, the control signal (Sig_first), the first coefficient flag (Sig) and the second coefficient flag (Last) are all equal to one. Since the second coefficient flag (Last) is one, the coefficient map encoding process is finished (case 2).

According to another embodiment of the invention, in the third case, when the control signal (Sig_first) is one and the first coefficient flag (Sig) which is the first coefficient flag detected by the reorganizing unit 110 is zero, the next coefficient flag detected by the reorganizing unit 110 is a next first coefficient flag (Sig) and the reorganizing unit 110 generates the second bin (bin_val_2) corresponding to the next first coefficient flag (Sig) accordingly. The reorganizing unit 110 further outputs the position parameter (Sig_pos_1) and the position parameter (Sig_pos_2) for the first bin (bin_val_1) and the second bin (bin_val_2) to the context formation engines 121 and 122 respectively. For example, the position of the detected first coefficient flag (Sig) is "a" and the position of the detected next first coefficient flag (Sig) is "a+1".

In the third case, the control signal (Sig_first) is one, the first coefficient flag (Sig) is zero and the next first coefficient flag (Sig) is zero. The value of the control signal (Sig_first) updated by the reorganizing unit 110 for the next clock cycle is one and the first position parameter (Sig_pos_1) for the next cycle is added two as "a+2" (Add two to the current first position parameter Sig_pos_1 of "a") for indicating where to detect coefficient flags during the next clock cycle (case 3). Similarly, the value of the second position parameter Sig/Last_pos_2 depends on the value of the first coefficient flag (Sig) detected during next cycle. According to the third case, the position parameter of the first coefficient flag (Sig) is "a" and that of the next first coefficient flag (Sig) is "a+1". The reorganizing unit 110 then detect the first coefficient flag (Sig) first during the next clock cycle at position parameter "a+2".

In the fourth case, the control signal (Sig_first) is one, the first coefficient flag (Sig) is zero and the next first coefficient flag (Sig) is one. The second control signal (Sig_first) updated by the reorganizing unit 110 for the next clock cycle is zero and the first position parameter (Last_pos_1) for the next clock cycle is added one as "a+1" (Add one to the current first position parameter Sig_pos_1 of "a") for indicating where to detect coefficient flags during the next clock cycle (case 4). Similarly, the value of the second position parameter Sig/Last_pos_2 depends on the value of the second coefficient flag (Last) detected during next cycle. For example, if the second coefficient flag (Last) detected at position "a+1" during next cycle is zero, the second position parameter Sig/Last_pos_2 is "a+2" and corresponds to a first coefficient flag (Sig). Otherwise, the coefficient map encoding process is finished. According to the fourth case, the position parameter of the detected first coefficient flag (Sig) is "a" and that of the next detected first coefficient flag (Sig) is "a+1". The reorganizing unit 110 then detect the second coefficient flag (Last) during the next clock cycle at position parameter "a+1". If the second coefficient flag (Last) detected during the next clock cycle is zero, the reorganizing unit 110 then detect another first coefficient flag (Sig) during the next clock cycle at position parameter "a+2".

According to another embodiment of the invention, when the control signal (Sig_first) is zero, the reorganizing unit 110 first detects the second coefficient flag (Last) and generates the first bin (bin_val_1) corresponding to the detected second coefficient flag (Last).

In the fifth case, when the control signal (Sig_first) is zero and the detected second coefficient flag (Last) is one, the coefficient map encoding process is finished (case 5).

According to another embodiment of the invention, when the detected second coefficient flag (Last) is zero, the reorganizing unit 110 then detects the first coefficient flag (Sig) and generates the second bin (bin_val_2) corresponding to the detected first coefficient flag (Sig).

In the sixth case, when the control signal (Sig_first) is zero, the detected second coefficient flag (Last) is zero and first coefficient flag (Sig) is zero, the second control signal (Sig_first) updated by the reorganizing unit 110 for the next clock cycle is one and the first position parameter (Sig_pos_1) for the next clock cycle is added two as "a+2" (Add two to the current first position parameter Last_pos_1 of "a") for indicating where to detect coefficient flags during the next clock cycle (case 6). For example, according to the sixth case, the position parameter of the detected second coefficient flag (Last) is "a" and the detected first coefficient flag (Sig) is "a+1". The reorganizing unit 110 detects a next first coefficient flag (Sig) during the next clock cycle at position parameter "a+2".

In the seventh case, when the control signal (Sig_first) is zero, the detected second coefficient flag (Last) is zero and the detected first coefficient flag (Sig) is one, the second control signal (Sig_first) updated by the reorganizing unit 110 for the next clock cycle is zero and the first position parameter (Last_pos_1) for the next clock cycle is added one as "a+1" (Add one to the current first position parameter Last_pos_1 of "a") for indicating where to detect coefficient flags during the next clock cycle (case 7). For example, according to the seventh case, the position parameter of the detected second coefficient flag (Last) is "a" and the position parameter of the detected first coefficient flag (Sig) is "a+1". The reorganizing unit 110 then detects the next second coefficient flag (Last) at position parameter "a+1" during the next cycle. If the second coefficient flag (Last) at position parameter "a+1" is zero, the reorganizing unit 110 accordingly detects the first coefficient flag (Sig) at position parameter "a+2".

For clarity, the following table 1 shows the summary of the cases 1-7 described above.

TABLE 1

| (Sig_first = 1) | (Case 1) | syntax: | Sig | Last | next cycle |
|---|---|---|---|---|---|
| | | | 1 | 0 | →Sig_first = 1 |
| | | sig_pos | a | | →a + 1 |
| | | last_pos | a | | |
| | (Case 2) | syntax: | Sig | Last | next cycle |
| | | | 1 | 1 | →encoding end |
| | | sig_pos | a | | |
| | | last_pos | a | | |
| | (Case 3) | syntax: | Sig | Sig | next cycle |
| | | | 0 | 0 | →Sig_first = 1 |
| | | sig_pos | a | a + 1 | →a + 2 |
| | | last_pos | a | | |
| | (Case 4) | syntax: | Sig | Sig | next cycle |
| | | | 0 | 1 | →Sig_first = 0 |
| | | sig_pos | a | a + 1 | |
| | | last_pos | a | | →a + 1 |
| (Sig_first = 0) | (Case 5) | syntax: | Last | x | next cycle |
| | | | 1 | | →encoding end |
| | | sig_pos | a + 1 | | →0 |
| | | last_pos | a | | →0 |
| | (Case 6) | syntax: | Last | Sig | next cycle |
| | | | 0 | 0 | →Sig_first = 1 |
| | | sig_pos | a + 1 | | →a + 2 |
| | | last_pos | a | | |
| | (Case 7) | syntax: | Last | Sig | next cycle |
| | | | 0 | 1 | →Sig_first = 0 |
| | | sig_pos | a + 1 | | |
| | | last_pos | a | | →a + 1 |

Figure 2:
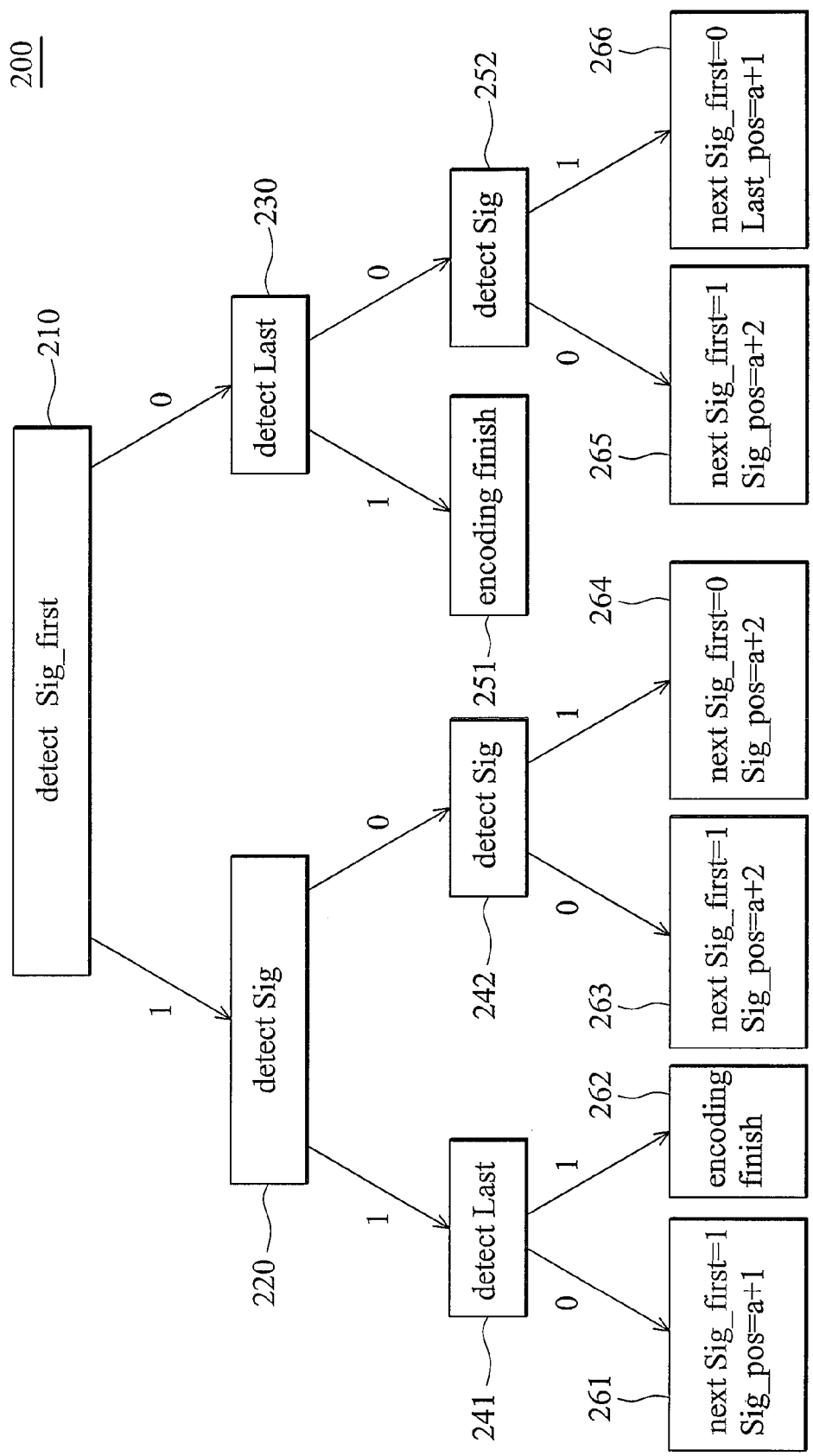
FIG. 2 is a flow chart of a CABAC encoding method according to another embodiment of the invention.

FIG. 2 is a flow chart of a CABAC encoding method 200 according to another embodiment of the invention. First, the reorganizing unit 110 detects a control signal (Sig_first) (step 210) and receives a plurality of first coefficient flags (Sig) and second coefficient flags (Last). Then, the reorganizing unit 110 detects at least two coefficient flags every clock cycle in sequence according to according to the control signal (Sig_first).

For example, when the control signal (Sig_first) is one, the reorganizing unit 110 detects the first coefficient flag (Sig) (step 220). However, when the control signal (Sig_first) is zero, the reorganizing unit 110 detects the second coefficient flag (Last) (step 230).

When the control signal (Sig_first) is one and the first coefficient flags (Sig) is one, the reorganizing unit 110 detects the second coefficient flag (Last) (step 241). When the first coefficient flag (Sig) is one and the second coefficient flag (Last) is zero (above case 1), the reorganizing unit 110 updates the control signal (Sig_first) to be one for the next clock cycle, indicating the first coefficient flag detected in the next clock cycle is a first coefficient flag (Sig) and the first position parameter (Sig_pos_1) for the next clock cycle is "a+1" if the current first and second position parameters (Sig_pos_1) and (Last_pos_2) are "a" (step 261). When the detected first coefficient flag (Sig) is one and the detected second coefficient flag (Last) is one (above case 2), the coefficient map encoding is finished (step 262).

When the control signal (Sig_first) detected is one in step 210 and the first coefficient flag (Sig) detected at position parameter "a" is zero in step 220, the reorganizing unit 110 detects a next first coefficient flag (Sig) (step 242) at position "a+1". When the detected first coefficient flag (Sig) at position parameter "a" is zero and the detected next first coefficient flag (Sig) at position parameter "a+1" is zero, the reorganizing unit 110 updates the control signal (Sig_first) to be one for the next clock cycle, indicating the first flag detected in the next clock cycle is a first coefficient flag (Sig) and the first position parameter (Sig_pos_1) for the next clock cycle is "a+2" (step 263, above case 3).

When the first coefficient flag (Sig) detected in step 220 is zero and the next first coefficient flag (Sig) detected in step 242 is one, the reorganizing unit 110 updates the control signal (Sig_first) to be zero for the next clock cycle, indicating the first flag detected in the next clock cycle is a second coefficient flag (Last) and the first position parameter (Last_pos_1) for the next clock cycle is "a+1" if the current first and second position parameters (Sig_pos_1) and (Sig_pos_2) are "a" and "a+1" respectively (step 264, above case 4).

When the control signal (Sig_first) detected in step 210 is zero and the second coefficient flag (Last) detected in step 230 is one, the coefficient map encoding process is finished (step 251, above case 5).

When the control signal (Sig_first) detected in step 210 is zero and the second coefficient flag (Last) detected in step 230 is zero, the reorganizing unit 110 proceed to detect the first coefficient flag (Sig) (step 252).

When the control signal (Sig_first) is zero, the second coefficient flag (Last) detected in step 230 is zero and the first coefficient flag (Sig) detected in step 252 is zero, the reorganizing unit 110 updates the control signal (Sig_first) to be one for the next clock cycle, indicating the first coefficient flag detected in the next clock cycle is a first coefficient flag (Sig) and the first position parameter (Sig_pos_1) for the next clock cycle is "a+2" if the current first and second position parameters (Last_pos_1) and (Sig_pos_2) are "a" and "a+1" respectively (step 265, above case 6).

Conversely, when the control signal (Sig_first) detected in step 210 is zero, the second coefficient flag (Last) detected in step 230 is zero and the first coefficient flag (Sig) detected in step 252 is one, the reorganizing unit 110 updates the control signal (Sig_first) to be zero for the next clock cycle, indicating the first flag detected in the next clock cycle is a second coefficient flag (Last) and the first position parameter (Last_pos_1) for the next clock cycle is "a+1" if the current first and second position parameters (Last_pos_1) and (Sig_pos_2) are "a" and "a+1" respectively (step 266, above case 7).

It is noted that the CABAC encoder 100 encodes at least two coefficient flags, such as the first coefficient flag (Sig) and the second coefficient flag (Last), every clock cycle in sequence according to the position thereof and the control signal (Sig_first), improving the CABAC encoding efficiency.

Figure 3:
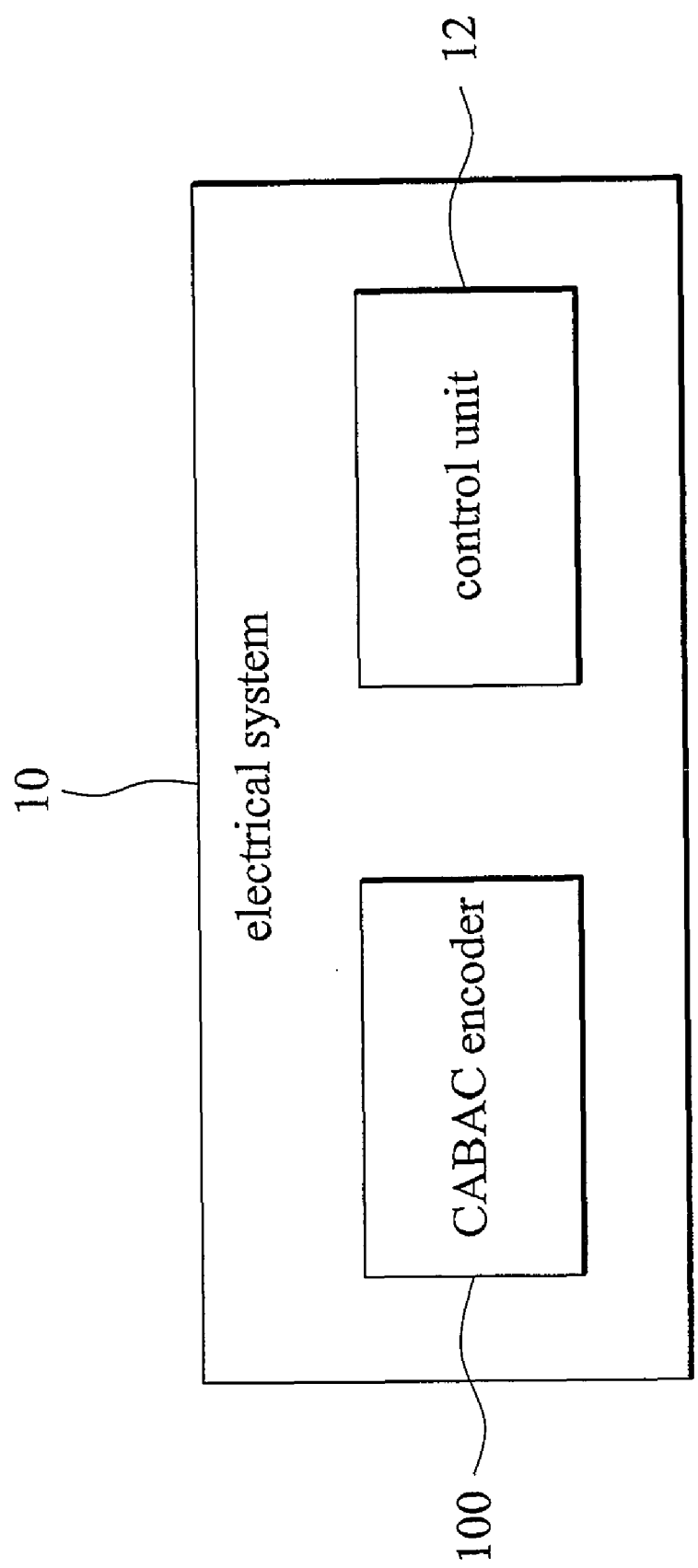
FIG. 3 shows an electrical system according to another embodiment of the invention.

FIG. 3 shows an electrical system 10 according to another embodiment of the invention. The electrical system 10 for display images comprises the CABAC encoder 100, control unit 12 and so on . . . . The electronic system 10 can be a mobile phone, digital camera, PDA (personal data assistant), notebook computer, desktop computer, television, or portable DVD player, for example. However, it is not limited that the electrical system 10 is the above devices.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A CABAC encoder, comprising
a reorganizing unit receiving a plurality of first coefficient flags (Sig) and second coefficient flags (Last), detecting at least two of the coefficient flags every clock cycle according to positions of the detected coefficient flags and a control signal (Sig_first) to generate a first bin (bin_val_1) and a second bin (bin_val_2) corresponding to the detected coefficient flags, updating a value of the next control signal (Sig_first) for a next clock cycle according to the detecting result, and generating a first position parameter (Sig/Last_pos_1) and a second position parameter (Sig/Last_pos_2) corresponding to positions of the first bin (bin_val_1) and second bin (bin_val_2);
a first context formation engine generating a first context index (Ctx_idx_1) according to the control signal (Sig_first) and the first position parameter (Sig/Last_pos_1);
a second context formation engine generating a second context index (Ctx_idx_2) according to the control signal (Sig_first), the second position parameter (Sig/Last_pos_2) and the first bin (bin_val_1); and
a CABAC coding engine receiving the first context index (Ctx_idx_1), the second context index (Ctx_idx_2), the first bin (bin_val_1) and the second bin (bin_val_2) and encoding the first bin (bin_val_1) according to the first context index (Ctx_idx_1) and encoding the second bin (bin_val_2) according to the second context index (Ctx_idx_2) to generate a bit stream,
wherein the first bin (bin_val_1) and the second bin (bin_val_2) are generated in one clock cycle, the first coefficient flag (Sig) indicates whether a corresponding coefficient value is zero, and the second coefficient flag (Last) indicates whether a coefficient map decoding process is finished.

2. The CABAC encoder as claimed in claim 1, wherein the reorganizing unit first detects one of the first coefficient flags (Sig) and second coefficient flags (Last) according to the control signal (Sig_first).

3. The CABAC encoder as claimed in claim 2, wherein when the control signal (Sig_first) is one, the reorganizing unit first detects the first coefficient flag (Sig) and generates the first bin (bin_val_1) corresponding to the detected first coefficient flag (Sig).

4. The CABAC encoder as claimed in claim 3, wherein when the detected first coefficient flags (Sig) is one, the reorganizing unit further detects the second coefficient flag (Last) and generates the second bin (bin_val_2) corresponding to the detected second coefficient flag (Last).

5. The CABAC encoder as claimed in claim 4, wherein when the detected first coefficient flag (Sig) is one and the detected second coefficient flag (Last) is zero, the reorganizing unit updates the value of the control signal (Sig_first) for the next clock cycle to be one and the first position parameter (Sig/Last_pos_1) for the next clock cycle is "a+1" if a current first and second position parameters (Sig/Last_pos_1) and (Sig/Last_pos_2) are "a".

6. The CABAC encoder as claimed in claim 4, wherein when the detected first coefficient flag (Sig) is one and the detected second coefficient flag (Last) is one, the coefficient map decoding process is finished.

7. The CABAC encoder as claimed in claim 3, wherein when the detected first coefficient flag (Sig) is zero, the reorganizing unit further detects a next first coefficient flag (Sig) and generates the second bin (bin_val_2) corresponding to the detected next first coefficient flag (Sig).

8. The CABAC encoder as claimed in claim 7, wherein when the detected first coefficient flag (Sig) is zero and the detected next first coefficient flag (Sig) is zero, the reorganizing unit updates the value of the control signal (Sig_first) for the next clock cycle to be one and the first position parameter (Sig/Last_pos_1) for the next clock cycle is "a+2" if a current first and second position parameters (Sig/Last_pos_1) and (Sig/Last_pos_2) are "a" and "a+1" respectively.

9. The CABAC encoder as claimed in claim 7, wherein when the detected first coefficient flag (Sig) is zero and the detected next first coefficient flag (Sig) is one, the reorganizing unit updates the value of the control signal (Sig_first) for the next clock cycle to be zero, and the first position parameter (Sig/Last_pos_1) for the next clock cycle is "a+1" if a current first and second position parameters (Sig/Last_pos_1) and (Sig/Last_pos_2) are "a" and "a+1" respectively.

10. The CABAC encoder as claimed in claim 2, wherein when the control signal (Sig_first) is zero, the reorganizing unit first detects the second coefficient flag (Last) and generates the first bin (bin_val_1) corresponding to the detected second coefficient flag (Last).

11. The CABAC encoder as claimed in claim 10, wherein when the detected second coefficient flag (Last) is one, the coefficient map decoding process is finished.

12. The CABAC encoder as claimed in claim 10, wherein when the detected second coefficient flag (Last) is zero, the reorganizing unit further detects the first coefficient flag (Sig) and generates the second bin (bin_val_2) corresponding to the detected first coefficient flag (Sig).

13. The CABAC encoder as claimed in claim 12, wherein when the detected second coefficient flag (Last) is zero and the detected first coefficient flag (Sig) is zero, the reorganizing unit updates the value of the control signal (Sig_first) for the next clock cycle to be one, and the first position parameter (Sig/Last_pos_1) for the next clock cycle is "a+2" if a current first and second position parameters (Sig/Last_pos_1) and (Sig/Last_pos_2) are "a" and "a+1" respectively.

14. The CABAC encoder as claimed in claim 12, wherein when the detected second coefficient flag (Last) is zero and the detected first coefficient flag (Sig) is one, the reorganizing unit updates the value of the control signal (Sig_first) for the next clock cycle to be zero, and the first position parameter (Sig/Last_pos_1) for the next clock cycle is "a+1" if a current first and second position parameters (Sig/Last_pos_1) and (Sig/Last_pos_2) are "a" and "a+1" respectively.

15. The CABAC encoder as claimed in claim 1, wherein the first context formation engine determines the first position parameter (Sig/Last_pos_1) corresponding to a position of the first coefficient flags (Sig) or the second coefficient flag (Last) according to the control signal (Sig_first), and the second context formation engine determines the second position parameter (Sig/Last_pos_2) corresponding to a position of the first coefficient flags (Sig) or the second coefficient flag (Last) according to the control signal (Sig_first) and the first bin (bin_val_1).

16. A CABAC encoding method for generating a bit stream, comprising
receiving a plurality of first coefficient flags (Sig) and second coefficient flags (Last);
detecting at least two coefficient flags every clock cycle according to positions of the detected coefficient flags and a control signal (Sig_first);
generating a first bin (bin_val_1) and a second bin (bin_val_2) corresponding to the detected coefficient flags according to the detecting result;
updating a value of the second control signal (Sig_first) for the next clock cycle according to the detecting result;
generating a first position parameter (Sig/Last_pos_1) and a second position parameter (Sig/Last_pos_2) corresponding to the positions of the first bin (bin_val_1) and second bin (bin_val_2) respectively;
generating a first context index (Ctx_idx_1) according to the control signal (Sig_first) and the first position parameter (Sig/Last_pos_1), and generating a second context index (Ctx_idx_2) according to the control signal (Sig_first), the second position parameter (Sig/Last_pos_2) and the first bin (bin_val_1); and
encoding the first bin (bin_val_1) and the second bin (bin_val_2) according to the first context index (Ctx_idx_1) and the second context index (Ctx_idx_2) respectively to generate the bit stream,
wherein the first bin (bin_val_1) and the second bin (bin_val_2) are generated in one clock cycle, the first coefficient flag (Sig) indicates whether a corresponding coefficient value is zero, and the second coefficient flag (Last) indicates whether a coefficient map decoding process is finished.

17. The CABAC encoding method as claimed in claim 16, wherein in the step of detecting at least two coefficient flags every clock cycle, one of the first coefficient flags (Sig) and second coefficient flags (Last) is detected first according to the control signal (Sig_first).

18. The CABAC encoding method as claimed in claim 17, wherein when the control signal (Sig_first) is one, the first coefficient flag (Sig) is first detected and a first bin (bin_val_1) corresponding to the detected first coefficient flag (Sig) is generated.

19. The CABAC encoding method as claimed in claim 18, wherein when the detected first coefficient flags (Sig) is one, the second coefficient flag (Last) is further detected and the second bin (bin_val_2) corresponding to the detected second coefficient flag (Last) is generated.

20. The CABAC encoding method as claimed in claim 19, wherein when the detected first coefficient flag (Sig) is one and the detected second coefficient flag (Last) is zero, the value of the control signal (Sig_first) for the next clock cycle is updated to be one and when the detected first coefficient flag (Sig) is one and the detected second coefficient flag (Last) is one, the coefficient map decoding process is finished.

21. The CABAC encoding method as claimed in claim 18, wherein when the detected first coefficient flag (Sig) is zero, a next first coefficient flag (Sig) is further detected and the second bin (bin_val_2) corresponding to the detected next first coefficient flag (Sig) is generated.

22. The CABAC encoding method as claimed in claim 21, wherein when the detected first coefficient flag (Sig) is zero and the detected next first coefficient flag (Sig) is zero, the value of the control signal (Sig_first) for the next clock cycle is updated to be one and when the detected first coefficient flag (Sig) is zero and the detected next first coefficient flag (Sig) is one, the value of the control signal (Sig_first) for the next clock cycle is updated to be zero.

23. The CABAC encoding method as claimed in claim 17, wherein when the control signal (Sig_first) is zero, the second coefficient flag (Last) is further detected and the first bin (bin_val_1) corresponding to the detected second coefficient flag (Last) is generated.

24. The CABAC encoding method as claimed in claim 23, wherein when the detected second coefficient flag (Last) is one, the coefficient map decoding process is finished and when the detected second coefficient flag (Last) is zero, the first coefficient flag (Sig) is further detected and the second bin (bin_val_2) corresponding to the detected first coefficient flag (Sig) is generated.

25. The CABAC encoding method as claimed in claim 24, wherein when the detected second coefficient flag (Last) is zero and the detected first coefficient flag (Sig) is zero, the value of the control signal (Sig_first) for the next clock cycle is updated to be one and when the detected second coefficient flag (Last) is zero and the detected first coefficient flag (Sig) is one, the value of the control signal (Sig_first) for the next clock cycle is updated to be zero.

* * * * *